United States Patent
Farooq et al.

(10) Patent No.: US 10,784,200 B2
(45) Date of Patent: Sep. 22, 2020

(54) IONIZING RADIATION BLOCKING IN IC CHIP TO REDUCE SOFT ERRORS

(75) Inventors: Mukta G. Farooq, Hopewell Junction, NY (US); Ian D. Melville, Highland, NY (US); Kevin S. Petrarca, Newburgh, NY (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 336 days.

(21) Appl. No.: 13/409,643

(22) Filed: Mar. 1, 2012

(65) Prior Publication Data
US 2012/0161300 A1   Jun. 28, 2012

Related U.S. Application Data

(62) Division of application No. 11/836,819, filed on Aug. 10, 2007, now Pat. No. 8,999,764.

(51) Int. Cl.
*H01L 23/532* (2006.01)
*H01L 23/556* (2006.01)

(52) U.S. Cl.
CPC ........ *H01L 23/5329* (2013.01); *H01L 23/556* (2013.01); *H01L 2924/0002* (2013.01); *Y10S 438/958* (2013.01); *Y10S 438/967* (2013.01)

(58) Field of Classification Search
None
See application file for complete search history.

(56) References Cited

U.S. PATENT DOCUMENTS

| 4,423,548 A | * | 1/1984 | Hulseweh | G11C 5/005 257/660 |
| 4,426,657 A | * | 1/1984 | Abiru | H01L 21/312 257/660 |
| 4,494,217 A | * | 1/1985 | Suzuki | H01L 23/057 257/660 |

(Continued)

FOREIGN PATENT DOCUMENTS

| EP | 0547989 A3 | 6/1993 |
| JP | 356141367 A | 11/1981 |

(Continued)

OTHER PUBLICATIONS

JP200200904A Saito English translation. 22 pgs. Translated Oct. 25, 2016.*

(Continued)

*Primary Examiner* — David E Graybill
(74) *Attorney, Agent, or Firm* — Scully, Scott, Murphy & Presser, P.C.; Alvin Borromeo, Esq.

(57) ABSTRACT

Methods of blocking ionizing radiation to reduce soft errors and resulting IC chips are disclosed. One embodiment includes forming a front end of line (FEOL) for an integrated circuit (IC) chip; and forming at least one back end of line (BEOL) dielectric layer including ionizing radiation blocking material therein. Another embodiment includes forming a front end of line (FEOL) for an integrated circuit (IC) chip; and forming an ionizing radiation blocking layer positioned in a back end of line (BEOL) of the IC chip. The ionizing radiation blocking material or layer absorbs ionizing radiation and reduces soft errors within the IC chip.

15 Claims, 5 Drawing Sheets

(56) References Cited

U.S. PATENT DOCUMENTS

| | | | |
|---|---|---|---|
| 4,541,003 A * | 9/1985 | Otsuka | H01L 21/26 174/350 |
| 4,641,165 A * | 2/1987 | Iizuka | G11C 11/404 257/297 |
| 4,661,837 A * | 4/1987 | Sono | H01L 23/145 257/660 |
| 4,690,999 A | 9/1987 | Numata et al. | |
| 4,725,504 A * | 2/1988 | Knudsen | H05K 3/181 428/458 |
| 4,792,476 A | 12/1988 | Numata et al. | |
| 4,806,395 A * | 2/1989 | Walsh | C23C 18/22 205/169 |
| 4,868,071 A * | 9/1989 | Walsh | C23C 18/22 428/626 |
| 4,890,083 A * | 12/1989 | Trenkler et al. | 335/301 |
| 4,894,124 A * | 1/1990 | Walsh | C23C 18/22 205/167 |
| 5,015,517 A * | 5/1991 | Walsh | C23C 18/22 428/156 |
| 5,133,989 A | 7/1992 | Numata et al. | |
| 5,338,617 A | 8/1994 | Workinger et al. | |
| 5,371,404 A | 12/1994 | Juskey et al. | |
| 5,391,915 A * | 2/1995 | Mukai | H01L 21/312 257/640 |
| 5,406,025 A * | 4/1995 | Carlstedt | H01L 21/50 174/17.08 |
| 5,461,501 A * | 10/1995 | Sato | G02F 1/136277 349/111 |
| 5,536,584 A | 7/1996 | Sotokawa et al. | |
| 5,566,055 A | 10/1996 | Salvi, Jr. | |
| 5,597,736 A | 1/1997 | Sampsell | |
| 5,854,663 A * | 12/1998 | Oh | G02F 1/136209 349/106 |
| 5,906,882 A | 5/1999 | Valente et al. | |
| 5,926,702 A * | 7/1999 | Kwon | G02F 1/136209 349/106 |
| 5,932,485 A | 8/1999 | Schofield | |
| 5,965,679 A * | 10/1999 | Godschalx | C08G 61/10 526/281 |
| 6,081,305 A * | 6/2000 | Sato | G02F 1/13454 349/111 |
| 6,180,430 B1 | 1/2001 | Kong et al. | |
| 6,207,553 B1 * | 3/2001 | Buynoski et al. | 438/622 |
| 6,288,188 B1 * | 9/2001 | Godschalx | C08G 61/10 526/285 |
| 6,384,128 B1 | 5/2002 | Wadahara | |
| 6,423,630 B1 * | 7/2002 | Catabay | H01L 21/7682 257/E21.576 |
| 6,693,691 B2 * | 2/2004 | Sato | G02F 1/136277 349/113 |
| 6,831,363 B2 | 12/2004 | Dalton et al. | |
| 6,879,358 B2 * | 4/2005 | Sato | G02F 1/136277 349/111 |
| 6,924,348 B2 * | 8/2005 | Tajiri | C08G 73/1039 385/123 |
| 6,943,103 B2 | 9/2005 | Kuo et al. | |
| 6,992,001 B1 | 1/2006 | Lin | |
| 7,009,288 B2 * | 3/2006 | Bauer | H01L 23/295 257/690 |
| 7,285,817 B2 * | 10/2007 | Maemura | H01L 23/552 257/315 |
| 7,381,635 B2 | 6/2008 | Cabral, Jr. et al. | |
| 7,728,410 B2 | 6/2010 | Nakanishi | |
| 2002/0001937 A1 * | 1/2002 | Kikuchi et al. | 438/618 |
| 2002/0056923 A1 | 5/2002 | Wieczorek et al. | |
| 2003/0175454 A1 | 9/2003 | Lichtenstein et al. | |
| 2004/0113278 A1 | 6/2004 | Dalton et al. | |
| 2004/0222528 A1 * | 11/2004 | Kunikiyo | 257/758 |
| 2005/0121711 A1 | 6/2005 | Pogge et al. | |
| 2005/0156288 A1 | 7/2005 | Goodner | |
| 2005/0250255 A1 | 11/2005 | Chen | |
| 2006/0055044 A1 * | 3/2006 | Maemura et al. | 257/758 |
| 2007/0013073 A1 | 1/2007 | Cabral, Jr. et al. | |
| 2007/0045844 A1 | 3/2007 | Andry et al. | |
| 2007/0159171 A1 * | 7/2007 | Komuro | G01R 33/3806 324/318 |
| 2007/0284702 A1 | 12/2007 | Im | |
| 2009/0026442 A1 * | 1/2009 | Cheung | H01L 27/101 257/38 |
| 2009/0039515 A1 | 2/2009 | Farooq et al. | |
| 2009/0243053 A1 | 10/2009 | Cabral, Jr. et al. | |
| 2010/0009544 A1 * | 1/2010 | Sato | H01L 21/316 438/761 |
| 2012/0161300 A1 * | 6/2012 | Farooq et al. | 257/660 |
| 2014/0163338 A1 * | 6/2014 | Roesicke | 600/309 |

FOREIGN PATENT DOCUMENTS

| | | |
|---|---|---|
| JP | 57030345 A | 2/1982 |
| JP | 58222546 A | 12/1983 |
| JP | 405335776 | 12/1993 |
| JP | 10163209 A | 6/1998 |
| JP | 11288934 A | 10/1999 |
| JP | 2001174850 | 6/2001 |
| JP | 2002009074 A | 1/2002 |
| JP | 2002141662 A | 5/2002 |
| JP | 2003124363 A | 4/2003 |
| JP | 2004148852 | 5/2004 |
| JP | 2004263562 | 9/2004 |
| JP | 2005196628 | 7/2005 |

OTHER PUBLICATIONS

U.S. Appl. No. 11/836,819, filed Aug. 10, 2007, Office Action dated Oct. 21, 2010.
U.S. Appl. No. 11/836,819, filed Aug. 10, 2007, Office Action dated Jan. 25, 2010.
Escott, BM Ward, WC, Method for Preparing Very High Purity Silica for Use as a Filler, IBM Technical Disclosure Bulletin Apr. 1980.
U.S. Appl. No. 11/836,819, Office Action dated Aug. 25, 2014.
Graybill, David E., U.S. Appl. No. 11/836,819, Corrected Notice of Allowability, dated Dec. 18, 2014, 2 pages.
Graybill, David E., U.S. Appl. No. 11/836,819, Notice of Allowance, dated Nov. 24, 2014, 10 pages.
Graybill, David E., U.S. Appl. No. 11/836,819, Office Action, dated Mar. 21, 2014, 20 pages.

* cited by examiner

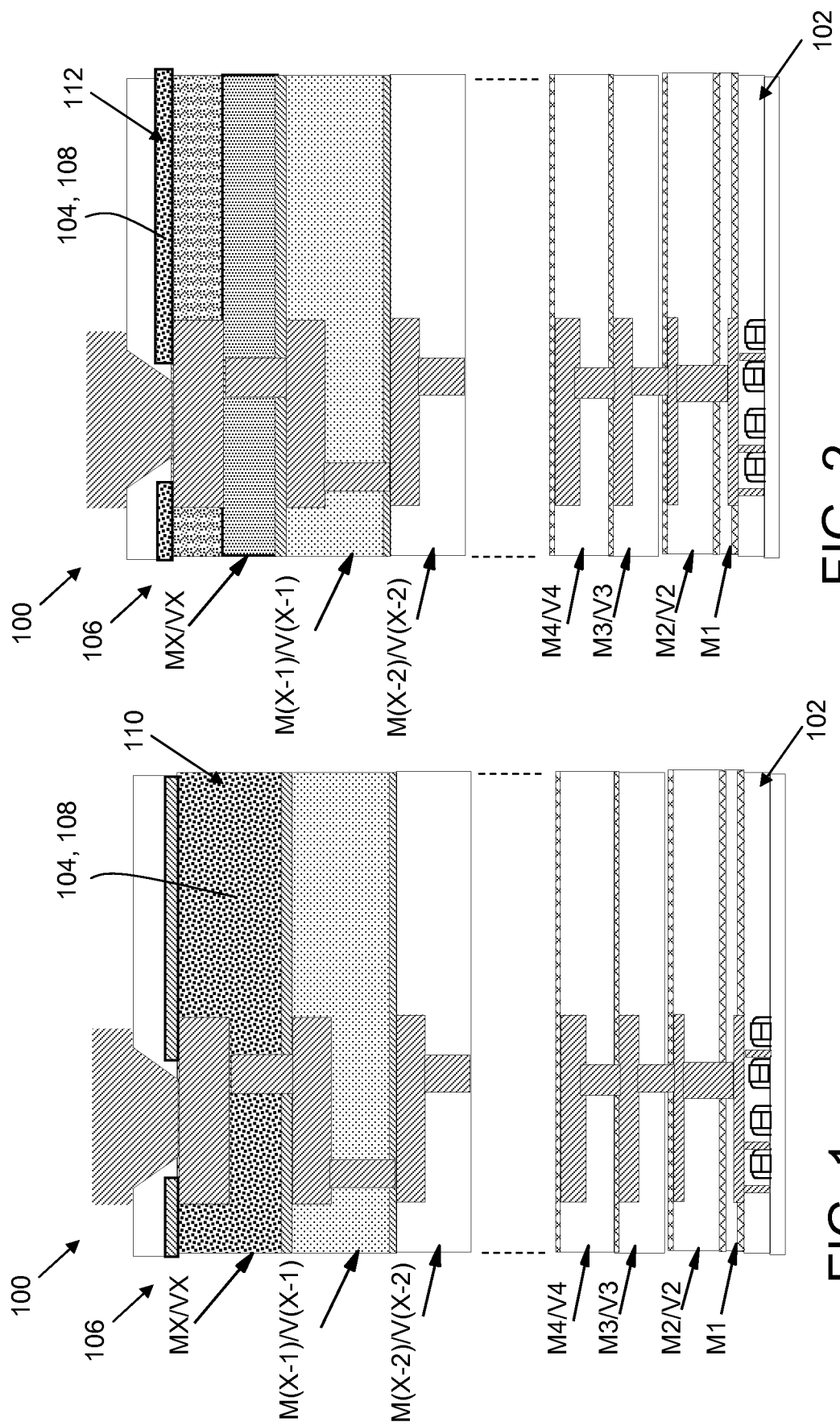

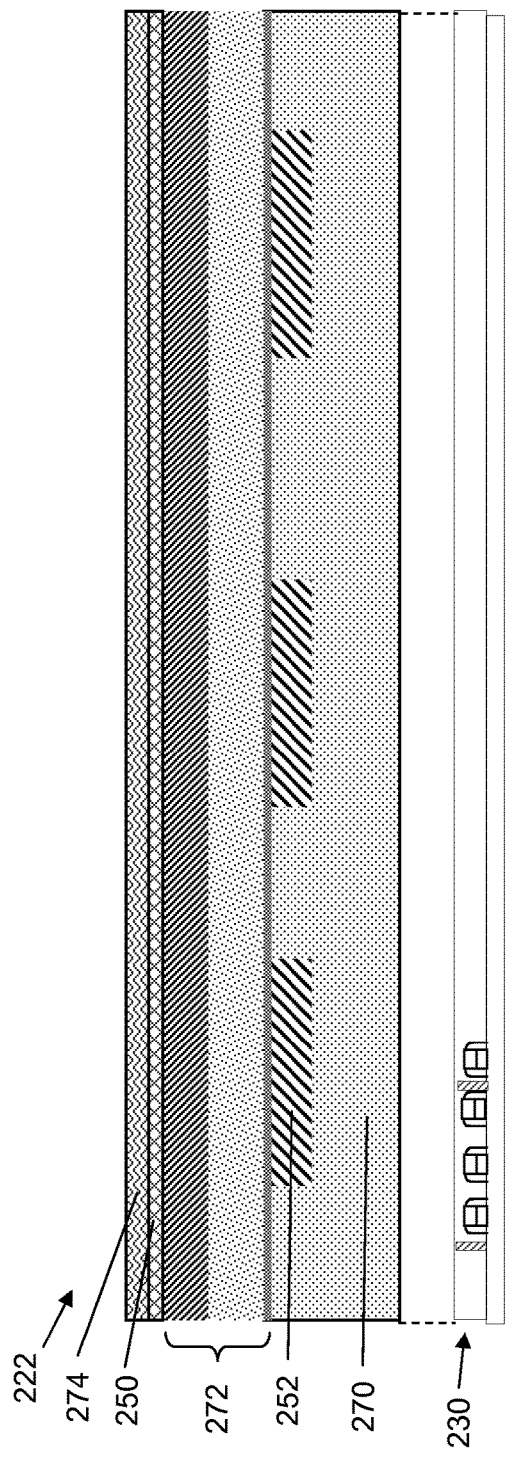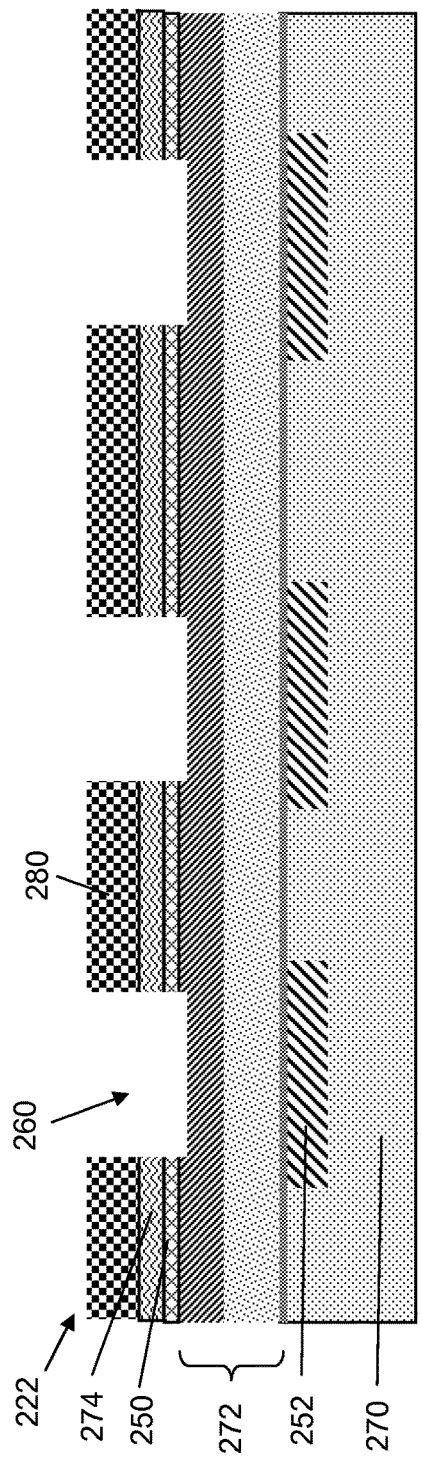

IONIZING RADIATION BLOCKING IN IC CHIP TO REDUCE SOFT ERRORS

CROSS-REFERENCE TO RELATED APPLICATIONS

This application is a divisional of U.S. patent application Ser. No. 11/836,819, filed on Aug. 10, 2007, currently pending and hereby incorporated by reference in its entirety.

BACKGROUND

1. Technical Field

The disclosure relates generally to integrated circuit (IC) chip fabrication, and more particularly, to ionizing radiation blocking in an IC chip to reduce soft errors.

2. Background Art

Soft errors caused by ionizing radiation including, for example, alpha particles, beta radiation, cosmic rays, high-frequency electromagnetic radiation, or other types of radiation capable of producing a change in electrical state, are an increasingly large problem for integrated circuit (IC) chip fabricators. In particular, the continual miniaturization of IC chip circuitry and increased performance requirements has caused fabricators to focus more attentively to soft error rates (SER) caused by ionizing radiation, which drain performance. One approach to address this issue is to use external radiation shields about an IC chip. Ionizing radiation, however, can enter an IC chip from a number of sources such as the package to which an IC chip is attached, e.g., through the interconnecting solder. As a result, external shields are not always effective. Another approach is to use special circuitry within an IC chip to prevent the ionizing radiation from altering electrical states. However, special circuitry spends resources, e.g., space, power, etc., that may be better used for the overall IC chip function.

SUMMARY

Methods of blocking ionizing radiation to reduce soft errors and resulting IC chips are disclosed. One embodiment includes forming a front end of line (FEOL) for an integrated circuit (IC) chip; and forming at least one back end of line (BEOL) dielectric layer including ionizing radiation blocking material therein. Another embodiment includes forming a front end of line (FEOL) for an integrated circuit (IC) chip; and forming an ionizing radiation blocking layer positioned in a back end of line (BEOL) of the IC chip. The ionizing radiation blocking material or layer absorbs ionizing radiation and reduces soft errors within the IC chip.

A first aspect of the disclosure provides a method comprising: forming a front end of line (FEOL) for an integrated circuit (IC) chip; and forming at least one back end of line (BEOL) dielectric layer including ionizing radiation blocking material therein.

A second aspect of the disclosure provides an integrated circuit (IC) chip comprising: at least one back end of line (BEOL) dielectric layer including ionizing radiation blocking material therein.

A third aspect of the disclosure provides a method comprising: forming a front end of line (FEOL) for an integrated circuit (IC) chip; and forming an ionizing radiation blocking layer positioned in a back end of line (BEOL) of the IC chip.

A fourth aspect of the disclosure provides an integrated circuit (IC) chip comprising: an ionizing radiation blocking layer positioned in a back end of line (BEOL) of the IC chip.

A fifth aspect of the disclosure provides an integrated circuit (IC) chip having: a first layer of the integrated circuit chip; a first metallization layer over the first layer; and at least one dielectric layer over the first metallization layer, the at least one dielectric layer including ionizing radiation blocking material therein, wherein the ionizing radiation blocking material is configured to block or absorb ionizing radiation.

A sixth aspect of the disclosure provides an integrated circuit (IC) chip having: a first metallization layer; and a dielectric layer over the first metallization layer, the dielectric layer including an ionizing radiation blocking layer configured to block or absorb ionizing radiation.

A seventh aspect of the disclosure provides an integrated circuit (IC) chip having: a first back end of the line (BEOL) dielectric layer; a conductor located within the BEOL dielectric layer; a second BEOL dielectric layer over the first BEOL dielectric layer; and an ionizing radiation blocking material layer over the second BEOL, wherein the ionizing radiation blocking material layer is configured to block or absorb ionizing radiation, wherein the ionizing radiation blocking material layer is distanced from the conductor.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 1 shows a cross-sectional view of a first embodiment of an IC chip including a dielectric having ionizing radiation blocking material therein according to one embodiment of the disclosure.

FIG. 2 shows a cross-sectional view of a second embodiment of an IC chip including a dielectric having ionizing radiation blocking material therein according to one embodiment of the disclosure.

FIGS. 3-6 show cross-sectional views of one embodiment of a method of reducing soft errors including forming an ionizing radiation blocking layer according to the disclosure, with FIG. 6 showing one embodiment of the resulting IC chip.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 5:
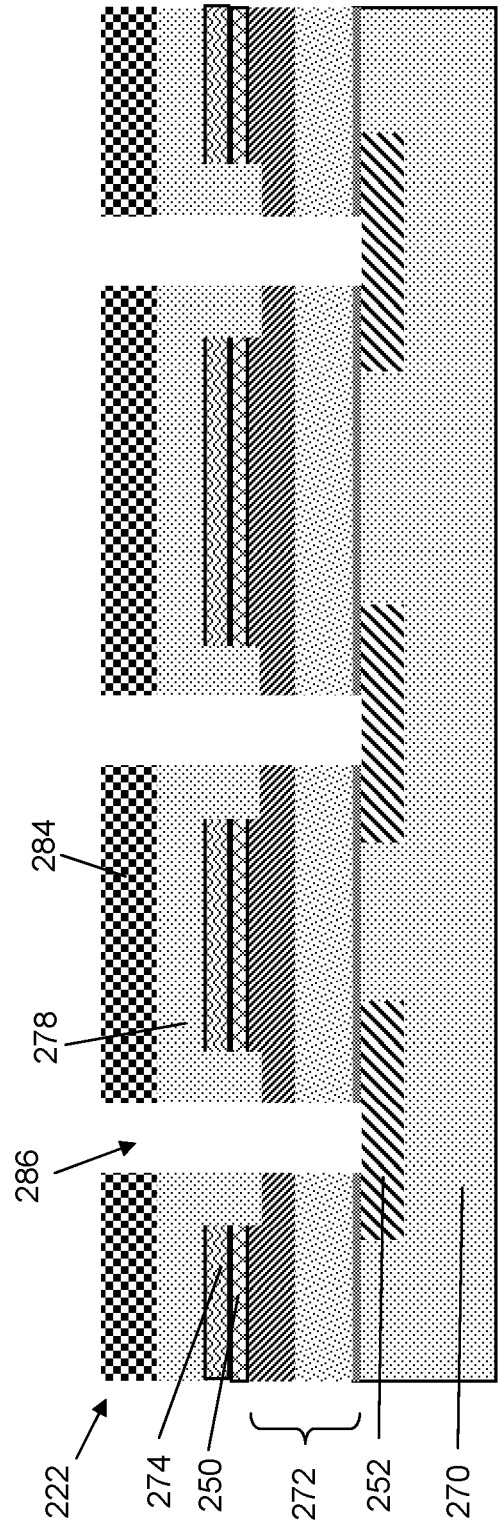

The disclosure includes a number of methods and IC chips including ionizing radiation blocking material in a dielectric thereof or an ionizing radiation blocking layer to reduce soft errors. As used herein, "ionizing radiation" may include, for example, alpha particles, beta radiation, cosmic rays, high-frequency electromagnetic radiation, and/or other types of radiation capable of producing a change in electrical state. Various dielectrics may be used in forming the IC chips according to the disclosure. Unless otherwise specified, the dielectrics may be any dielectric material appropriate for the stated use. Such dielectrics may include but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a polyarylene ether (e.g., SiLK available from Dow Chemical Corporation), a spin-on silicon-carbon contained polymer material (available form JSR Corporation), other low dielectric constant (<3.9) material, or layers thereof.

FIGS. 1-2 show embodiments of a method according to the disclosure for blocking ionizing radiation to reduce soft errors in an IC chip 100. IC chip 100 includes at least one BEOL dielectric layer 104 including ionizing radiation blocking material 108 therein. A method according to one embodiment includes forming a front end of line (FEOL) layer 102 for IC chip 100. FEOL means operations performed on a semiconductor wafer in the course of device manufacturing up to first metallization (M1), while back end of line (BEOL) refers to operations performed on the semiconductor wafer in the course of device manufacturing following first metallization (M1). FEOL 102 may be formed using any now known or later developed techniques such as material deposition, ion implantation, photolithography, etching, etc. FEOL 102 may include any conventional IC chip structures, e.g., transistors, resistors, capacitors, interconnecting wiring, etc.

FIGS. 1-2 also show forming BEOL 106 including a plurality of BEOL dielectric layers M1 to MX/VX. As understood, each BEOL dielectric layer includes one or more dielectric layers, each of which may have a contact and/or wire interconnects positioned therein or therethrough. At least one BEOL dielectric layer 104 includes ionizing radiation blocking material 108 therein. Ionizing radiation blocking material 108 may be any material that absorbs ionizing radiation such as alpha particles. In one embodiment, ionizing radiation blocking material 108 may include: hafnium (Hf), zirconium (Zr), graphite (C), cadmium (Cd), cobalt (Co) or copper (Cu). In the embodiment shown in FIG. 1, BEOL dielectric layer 104 is positioned as a penultimate BEOL dielectric layer 110 and may include an oxide such as silicon oxide ($SiO_2$). In the embodiment shown in FIG. 2, BEOL dielectric layer 104 is positioned as a last BEOL dielectric layer 112 and may include a polymer such as a polyimide (e.g., a photosensitive polyimide (PSPI)). In one particular embodiment, BEOL dielectric layer 104 (FIG. 2) includes dielectric 106 including a polyimide and ionizing radiation blocking material 108 includes copper (Cu). It is understood that BEOL dielectric layer 104 may also be positioned at different levels of BEOL 106.

The mechanism for forming BEOL dielectric layer 104 including ionizing radiation blocking material 108 varies depending on the dielectric material used. In some instances, it may be difficult to form BEOL dielectric layer 104 and combine in ionizing radiation blocking material 108 during formation of the dielectric, e.g., where the dielectric includes an oxide. In this case, BEOL dielectric layer(s) 104 forming includes forming the dielectric (on the wafer) with ionizing radiation blocking material 108 previously combined therein. That is, the dielectric material is manufactured with ionizing radiation blocking material 108 therein and BEOL dielectric layer 104 is formed using that material, e.g., by any conventional deposition technique. In other cases, it may be possible to simultaneously form BEOL dielectric layer 104 and combine ionizing radiation blocking material 108 therein. For example, where the dielectric includes a polymer, it may be possible to deposit the polymer while introducing ionizing radiation blocking material 108 thereto, e.g., by any conventional deposition technique for the dielectric and by introducing particles of ionizing radiation blocking material 108.

While FIGS. 1 and 2 show BEOL dielectric layer 104 as a single layer, it is understood that it may include multiple adjacent layers. Furthermore, while only one BEOL dielectric layer 104 is shown for each IC chip 100, it may be possible to provide more than one BEOL dielectric layer 104 with ionizing radiation blocking material 108 therein.

Figure 6:
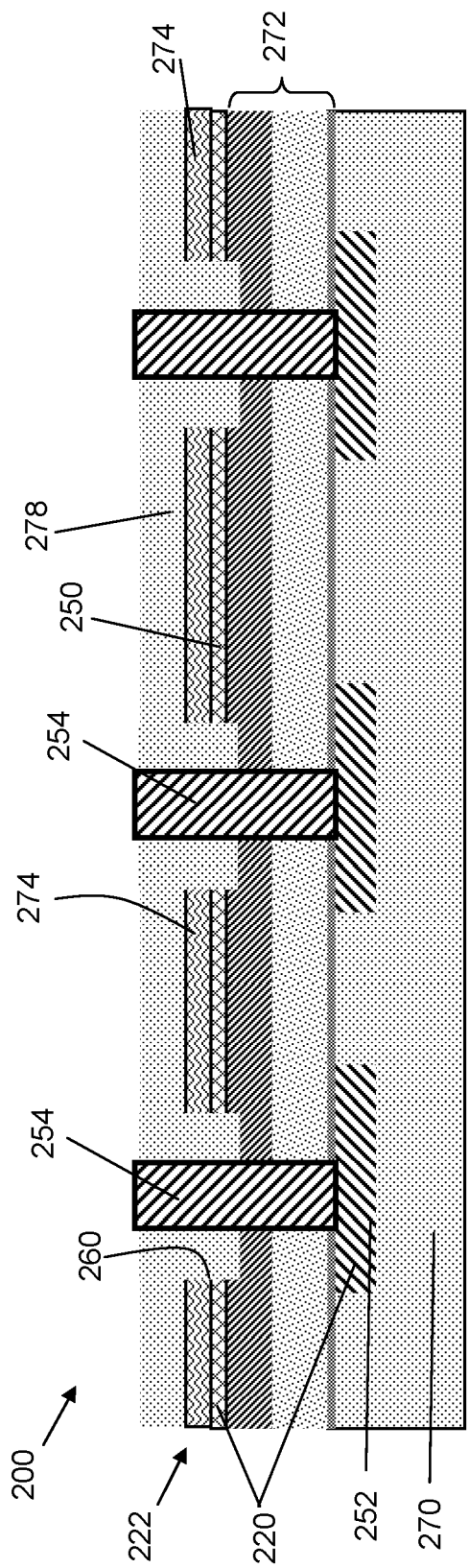
Figure 7:
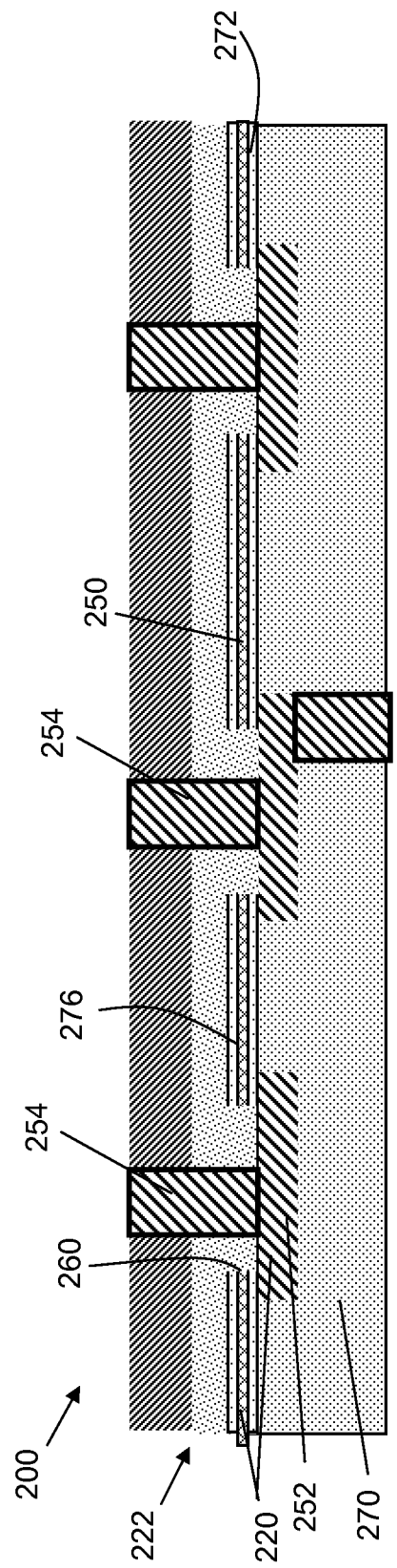
FIG. 7 shows a cross-sectional view of an alternative embodiment of the method of FIGS. 3-6 and another embodiment of the resulting IC chip.

Referring to FIGS. 3-7, other embodiments of methods for blocking ionizing radiation to reduce soft errors in an IC chip 200 (FIGS. 6 and 7) are shown. In these embodiments, as shown in FIGS. 6 and 7, IC chip 200 may include an ionizing radiation blocking layer 220 positioned in BEOL 222. By "in BEOL" 222 is meant that ionizing radiation blocking layer 220 may be within any BEOL dielectric layer, between any BEOL dielectric layers or located across a plurality of BEOL dielectric layers. FIG. 3 shows forming a FEOL 230 (only shown in FIG. 3 for clarity). FEOL 230 may be formed using any now known or later developed technique, such as material deposition, photolithography, etching, etc., and may include any conventional IC chip structures, e.g., transistors, resistors, capacitors, interconnecting wiring, etc.

Forming ionizing radiation blocking layer 220 (FIG. 6) positioned in BEOL 222 follows FEOL 230 formation. Ionizing radiation blocking layer 220 includes an ionizing radiation blocking film 250 and a conductor 252 that overlaps an opening or discontinuity 260 (FIG. 6) in film 250 through which a contact 254 may extend. FIGS. 4-6 show forming ionizing radiation blocking layer 220 with ionizing radiation blocking film 250 thereof between two different BEOL dielectric layers 272, 274 of different material and distanced from conductor 252. In contrast, FIG. 7 shows an alternative embodiment in which film 250 is positioned between a BEOL dielectric layer 272 and another BEOL dielectric layer 276 that are the same material. Also, in FIG. 7, film 250 is above conductor 252, i.e., not distanced greatly from conductor 252, typically in the range of 150 to 1000 Å. BEOL dielectric layer(s) 272, 274, 276 may be at any position within BEOL 222 from M1 up to a last BEOL dielectric layer. As seen in FIGS. 6 and 7, ionizing radiation blocking layer 220 is positioned across a plurality of BEOL dielectric layers and is laterally discontinuous in any one BEOL dielectric layer but forms a complete plane in a vertical sense because of an overlap of conductor 252 and opening or discontinuity 260 in film 250, i.e., when viewed in a plan view. As such, layer 220 substantially blocks ionizing radiation.

Returning to FIG. 3, in one embodiment ionizing radiation blocking layer 220 forming may include the following process. As shown in FIG. 3, conductor 252, e.g., an operational conductor of IC 200 (FIG. 6), is formed in a first BEOL dielectric layer 270. Conductor 252 may be formed using any conventional or later developed damascene or dual damascene processing. A second BEOL dielectric layer 272 is formed over conductor 252, e.g., by any conventional or later developed deposition techniques. As indicated, second BEOL dielectric layer 272 may include any number of dielectric layers. In FIG. 3, three layers are shown and in FIG. 7 only one layer is shown. Ionizing radiation blocking film 250 is formed over second BEOL dielectric layer 272. Ionizing radiation blocking film 250 may include any material capable of absorbing ionizing radiation such as: hafnium (Hf), zirconium (Zr), graphite (C), cadmium (Cd), cobalt (Co) and copper (Cu). If necessary, a liner material (not shown) may be employed to prevent diffusion. If ionizing radiation blocking film 250 is in a last BEOL dielectric layer, there may be some concern for aluminum (Al) shorting from package interconnects (not shown) to film 250. In this case, a BEOL dielectric layer 274, e.g., a silicon nitride ($Si_3N_4$) cap, may be deposited over film 250. Otherwise, layer 274 may represent the start of another BEOL layer.

FIG. 4 shows forming an opening or discontinuity 260 through ionizing radiation blocking film 250, e.g., by depositing and patterning a photoresist 280 and etching. Opening 260 extends through film 250 to an underlying layer, i.e., first BEOL dielectric layer 272 in FIG. 4 or conductor 252 in FIG. 7. FIGS. 5-6 show filling opening 260 with a third BEOL dielectric layer 278, and forming a contact 254 through third BEOL dielectric layer 278 (and first BEOL dielectric layer 272) to conductor 252, e.g., by depositing and patterning a photoresist 284, etching to form an opening 286, depositing a liner and conductor, and planarizing. Contact 254 is not as wide as opening 260 for purposes described herein.

FIG. 6 shows ionizing radiation blocking layer 220 in which ionizing radiation blocking film 250 is distanced from conductor 252 by second BEOL dielectric layer 272, which forms a part of layer 220. FIG. 7 shows ionizing radiation blocking film 250 above conductor 252 to allow a more complete block of ionizing radiation. In either scenario, an inner edge (i.e., outer edge of opening 260) of ionizing radiation blocking film 250 is distanced from an edge of contact 254 to prevent a short. In addition, conductor 252 laterally overlaps opening 260 of film 250 so as to form a continuous ionizing radiation blocking layer 220. As such, even though ionizing radiation blocking layer 220 is positioned in a plurality of BEOL dielectric layers and is laterally discontinuous in any one BEOL dielectric layer, it forms a complete plane in a vertical sense because of the overlap of conductor 252 and opening 260 in film 250, i.e., when viewed in a plan view.

Figure 8:
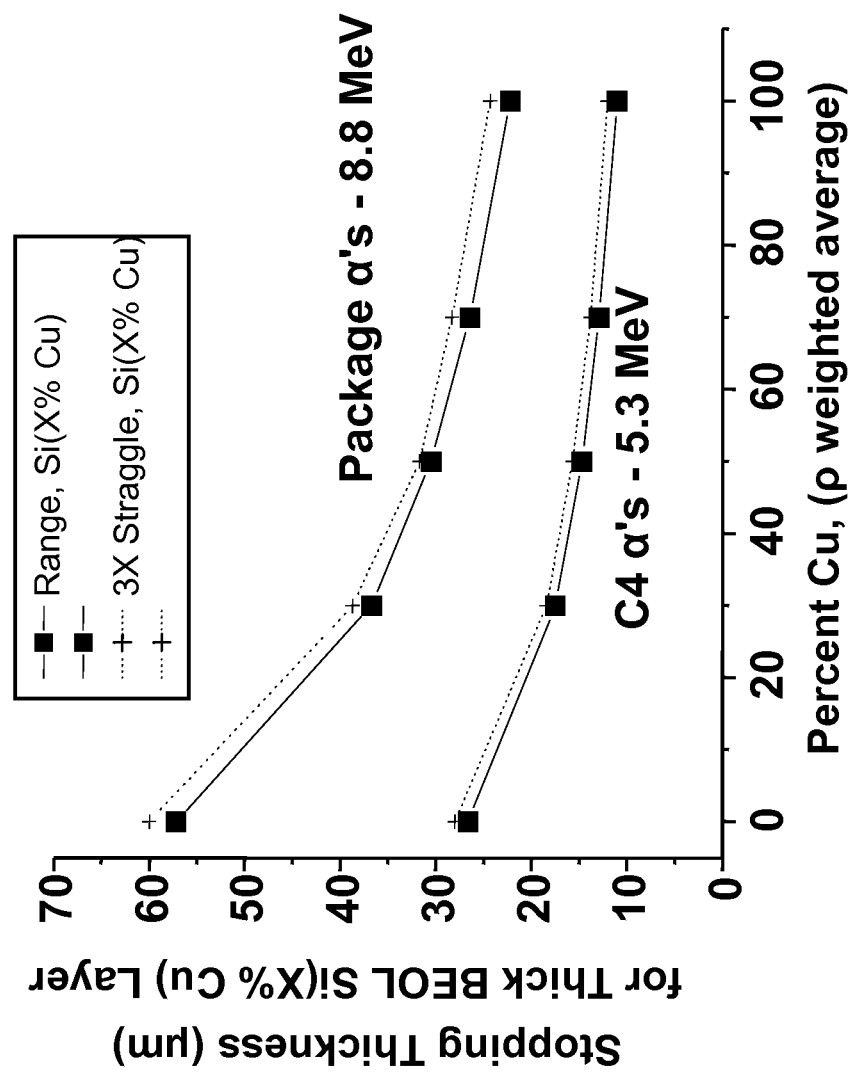
FIG. 8 shows a graph illustrating the effectiveness of the ionizing radiation blocking material embodiment of FIGS. 1-2.

FIG. 8 shows a graph illustrating how a dielectric including an ionizing radiation blocking material (as in FIGS. 1-2) reduces soft errors. FIG. 8 shows stopping thickness required for BEOL dielectric layer 104 and ionizing radiation blocking material 108 including copper and silicon oxide $Cu_x(SiO_2)_y$, versus percent of copper (Cu) for two different types of alpha particles. For example, for a controlled collapse chip connect (C4) caused alpha particle having 5.3 MeV energy, with 40% copper (weight average), BEOL dielectric layer 104 having just less than 20 μm is required to absorb the alpha particle. Similarly, for package caused alpha particle having 8.8 MeV energy, with 40% copper (weight average), BEOL dielectric layer 104 having just less than 40 μm is required to absorb the alpha particle. Similar results can be expected for the embodiments of FIGS. 3-7.

The methods as described above are used in the fabrication of integrated circuit chips. The resulting IC chips 100, 200 can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:
1. An integrated circuit (IC) chip comprising:
   a first layer including at least one of a transistor, a resistor, a capacitor or an interconnecting wire;
   a first metallization layer formed over the first layer; and
   at least one dielectric layer formed over the first metallization layer, the at least one dielectric layer including ionizing radiation blocking material positioned therein and forming a complete plane over the first layer and configured to block or absorb ionizing radiation, wherein the at least one dielectric layer includes:
      a first dielectric layer;
      a conductor formed in the first dielectric layer;
      a second dielectric layer formed directly over and contacting the conductor and the first dielectric layer;
      a discontinuous ionizing radiation blocking film formed over at least a portion of the second dielectric layer, the discontinuous ionizing radiation blocking film positioned above and overlapping the conductor;
      a back end of line (BEOL) dielectric layer formed entirely over the discontinuous ionizing radiation blocking film;
      an opening formed through the discontinuous ionizing radiation blocking film and the BEOL dielectric layer;
      a third dielectric layer formed directly on the BEOL dielectric layer and a portion of the second dielectric layer, wherein the third dielectric layer is vertically spaced apart from the discontinuous ionizing radiation blocking film by the BEOL dielectric layer and the third dielectric layer has a portion that is located on an entirety of a sidewall of the BEOL dielectric layer and an entirety of a sidewall of the discontinuous ionizing radiation blocking film; and
      a contact formed through the second dielectric layer and the third dielectric layer to contact the conductor, wherein an inner edge of the discontinuous ionizing radiation blocking film is distanced from an edge of the contact and separated by the third dielectric layer, and wherein the conductor laterally overlaps the opening.
2. The IC chip of claim 1, wherein the at least one dielectric layer includes a polyimide and the ionizing radiation blocking material includes copper (Cu).

3. The IC chip of claim 1, wherein the ionizing radiation blocking material is selected from the group consisting of: hafnium (Hf), zirconium (Zr), graphite (C), cadmium (Cd) and cobalt (Co).

4. The IC chip of claim 1, wherein a dielectric of the at least one dielectric layer is selected from the group consisting of:
a polymer and an oxide.

5. The IC chip of claim 4, wherein the polymer includes a polyimide.

6. The IC chip of claim 1, wherein the ionizing radiation includes an alpha particle.

7. The IC chip of claim 1, wherein the ionizing radiation includes at least one of beta radiation, cosmic rays, or electromagnetic radiation.

8. An integrated circuit (IC) chip comprising:
a first layer including at least one of a transistor, a resistor, a capacitor or an interconnecting wire;
a first metallization layer formed over the first layer;
a first dielectric layer formed above the first metallization layer;
a conductor formed within the first dielectric layer;
a second dielectric layer formed directly over and contacting the first dielectric layer and a portion of the conductor;
an ionizing radiation blocking film formed over the second dielectric layer, the ionizing radiation blocking film positioned above and overlapping the portion of the conductor;
a back end of line (BEOL) dielectric layer formed entirely over the ionizing radiation blocking film;
an opening formed through the ionizing radiation blocking film and the BEOL dielectric layer;
a third dielectric layer formed directly on the BEOL dielectric layer and a portion of the second dielectric layer, wherein the third dielectric layer is vertically spaced apart from the ionizing radiation blocking film by the BEOL dielectric layer and the third dielectric layer has a portion that is located on an entirety of a sidewall of the BEOL dielectric layer and an entirety of a sidewall of the ionizing radiation blocking film; and
a contact formed through the second dielectric layer and the third dielectric layer to contact the conductor, wherein the ionizing radiation blocking film forms a complete plane over the first layer, and is configured to block or absorb ionizing radiation, and wherein an inner edge of the ionizing radiation blocking film is distanced from an edge of the contact and separated by the third dielectric layer, and wherein the conductor laterally overlaps the opening.

9. The IC chip of claim 8, wherein the ionizing radiation blocking film is selected from the group consisting of: hafnium (Hf), zirconium (Zr), graphite (C), cadmium (Cd), cobalt (Co) and copper (Cu).

10. The IC chip of claim 8, wherein a dielectric material of at least one of the first dielectric layer, the second dielectric layer, the BEOL dielectric layer or the third dielectric layer is selected from the group consisting of:
a polymer and an oxide.

11. The IC chip of claim 8, wherein the second dielectric layer includes a plurality of distinct dielectric layers.

12. The IC chip of claim 8, wherein the second dielectric layer includes a single dielectric layer.

13. The IC chip of claim 1, wherein the second dielectric layer includes a plurality of distinct dielectric layers.

14. The IC chip of claim 1, wherein the third dielectric layer is formed between the contact and the BEOL dielectric layer.

15. The IC chip of claim 1, wherein the at least one dielectric layer includes one of:
a last dielectric layer or a penultimate dielectric layer.

* * * * *